United States Patent
Tezuka

(10) Patent No.: US 7,368,829 B2
(45) Date of Patent: May 6, 2008

(54) METHOD AND APPARATUS FOR DETECTING WELDING OF A RELAY CONTACT

(75) Inventor: Kazunari Tezuka, Sagamihara (JP)

(73) Assignees: NEC Corporation, Tokyo (JP); Fuji Jukogyo Kabushiki Kaisha, Tokyo (JP)

( * ) Notice: Subject to any disclaimer, the term of this patent is extended or adjusted under 35 U.S.C. 154(b) by 251 days.

(21) Appl. No.: 11/237,874

(22) Filed: Sep. 29, 2005

(65) Prior Publication Data
US 2006/0021098 A1 Jan. 26, 2006

(30) Foreign Application Priority Data
Mar. 31, 2003 (JP) .............................. 2003-095045

(51) Int. Cl.
*B60L 1/00* (2006.01)
(52) U.S. Cl. ...................................................... 307/9.1
(58) Field of Classification Search ................. 307/9.1
See application file for complete search history.

(56) References Cited

U.S. PATENT DOCUMENTS 5,369,540 A * 11/1994 Konrad et al. .................. 361/6
6,577,024 B2 * 6/2003 Kikuta et al. ............... 307/10.1

FOREIGN PATENT DOCUMENTS

| JP | 06-233401 A | 8/1994 |
|---|---|---|
| JP | 2000-78851 A | 3/2000 |
| JP | 2000-134707 A | 5/2000 |
| JP | 2000-173428 A | 6/2000 |
| JP | 2000-270561 A | 9/2000 |
| JP | 2000-278802 A | 10/2000 |
| JP | 2001-327001 A | 11/2001 |
| JP | 2003-102101 A | 4/2003 |
| JP | 2003-102102 A | 4/2003 |

* cited by examiner

*Primary Examiner*—Robert L. Deberadinis
(74) *Attorney, Agent, or Firm*—Sughrue Mion, PLLC

(57) ABSTRACT

A method for detecting a welding of a relay contact in a circuit having a DC power supply; a load circuit; a first main relay and a second main relay respectively inserted in a pair of power supply lines disposed between the DC power supply and the load circuit; and a precharge relay which is provided in parallel to the contact of the first main relay has the step of carrying out a sequence control to each of the relays (11, 12, 13) while measuring voltage across both ends of the load circuit (16) when shifting from a normal operation state in which a first main relay (11) and a second main relay (12) are controlled to be on and the precharge relay (13) is controlled to be off to a suspension state in which each of the relays (11, 12, 13) are controlled to be off. The welding of the relay contact of the first main relay (11) and the second main relay (12) is determined independently and separately from a correspondence between the proceeding of the sequence and the measured voltage.

19 Claims, 3 Drawing Sheets

METHOD AND APPARATUS FOR DETECTING WELDING OF A RELAY CONTACT

TECHNICAL FIELD

The present invention relates to a system having a DC (direct current) power supply such as a secondary battery, and a load circuit, for example an inverter circuit, or the like which is driven by the DC power supply. More particularly, the present invention relates to a method and an apparatus for detecting, in such a system, welding of relay contacts each of which is inserted in a pair of power supply lines between the DC power supply and the load circuit.

BACKGROUND ART

A hybrid electric automobile, an electric automobile, and the like have a constitution in which a motor is driven by an electric power from a DC power supply such as a secondary battery. In this case, the constitution in which a DC motor is directly driven by the electric power from the DC power supply is rarely employed. Instead, the electric power from the DC power supply is supplied to an inverter, and an AC (alternate current) power or a DC power to be supplied to the motor is generated by the inverter. By using the inverter, the control of a rotational frequency and an output torque of the motor can be carried out by a switching control at the inverter. In a case of a hybrid electric automobile, a battery pack of lithium-ion secondary battery cells, for example, is used for the DC power supply. A terminal voltage of the battery pack is 288 V, for example.

In a case of a usage for the hybrid electric automobile and the electric automobile, since a DC power supply with the voltage of 200 V or higher which is capable of making a large current flow is used, the relay contact is inserted, for the purpose of security or the like, in the power supply line on each of a positive side and a negative side of the DC power supply; and thereby the DC power supply is completely disconnected from a side of the load circuit such as the inverter when the DC power supply is not used. In addition, in a case of the usage for driving a motor, there occurs a considerable fluctuation of the load and an input voltage to the load circuit such as the inverter remarkably fluctuates in accordance therewith; and accordingly, in order to alleviate the fluctuation, a smoothing capacitor of a large capacity is provided between the positive side and the negative side of the power supply line on an input side of the load circuit.

FIG. 1 shows one example of the circuit which uses the battery pack constituted by serially connecting a plurality of cells of the secondary battery as the DC power supply and in which the relay contact is inserted for each of the positive power supply line and the negative power supply line from the DC power supply.

The circuit supplies the electric power from battery pack 10 to load circuit 16 such as the inverter circuit. A contact of first main relay 11 is inserted in the power supply line extended from the positive pole of battery pack 10 to one end of load circuit 16. Besides, an electric connection between battery pack 10 and load circuit 16 can be controlled by an ON (a conductive state)/OFF (an interruption state) control of first main relay 11. Similarly, a contact of second main relay 12 is inserted in the power supply line extended from the negative pole of battery pack 10 to the other end of load circuit 16. Capacitors 15 with a large capacity is provided in parallel to load circuit 16. Because of the provision of capacitor 15 here, it is possible that the contacts of main relays 11, 12 are fixed or welded due to a large rush current flowing into capacitor 15 when the contacts of main relays 11, 12 are turned from the interruption state to the conductive state. If the welding like this occurs, the relay contact does not transit to the interruption state again, and the function as the relay is lost. Of course, depending on the electrical characteristics of load circuit 16 itself, even in a case where there is no capacitor 15 specially provided, the large rush current large enough to weld the relay contact may sometimes flow in the circuit.

In this regard, a series circuit comprising resistor 14 and a contact of precharge relay 13 is provided in parallel to the contact of main relay 11 to prevent the welding of the relay contact. In other words, in a case where the electric power is supplied from the interruption state to load circuit 16, first, second main relay 12 on the negative side is set to be ON state; and next, the precharge relay 13 is set to be ON state. As a result, a charging current to capacitor 15 flows via resistor 14, and capacitor 15 is gradually charged. After that, first main relay 11 on the positive side is set to be ON state, then, following this, precharge relay 13 is set to be OFF state; and thereby the electric power is supplied from battery pack 10 to load circuit 16 via first main relay 11 and second main relay 12 without generating the large rush current.

However, if the precharge relay is provided, still it is possible that the welding of the contact of the main relay occurs. This is one of the reason why the main relays are provided for both of the positive and negative sides. In this regard, it is necessary to detect the occurrence of the welding at the contact of the main relay.

Japanese Laid-Open Patent Application No. 2000-270561 (JP, P2000-270561A) discloses that in a case where an inverter circuit is used as the load circuit, the welding of the main relay is determined by determining whether or not the output current of the inverter converges to zero after a lapse of a prescribed period of time when both of the main relays on the positive side and the negative side are controlled to be off. If the output current of the inverter does not converge to zero after the lapse of the prescribed period of time, this means that the electric power is supplied from the DC power supply side even when the main relay is controlled to be off. Accordingly, it is determined that the welding of the contact of the main relay occurs. However, with this method, it cannot be determined that the welding occurs unless the welding occurs at the contacts of both main relays and also it cannot be detected that the welding occurs at only one of either of the main relays.

Japanese Laid-Open Patent Application No. H06-233401 (JP, 6-233401, A) discloses that the relay having a mechanism for detecting the state of the movable part thereof is used as the main relay; and an abnormality such as welding and the like is detected when the movable part of the relay is at a position corresponding to the conductive state even when the relay is not controlled to be in the conductive state. However, in this method, it is necessary to provide the main relay with a special mechanism for detecting the state of the movable part thereof; and therefore this method lacks in versatility and also it is necessary to sufficiently pay attention to a reliability of the special mechanism itself.

Japanese Laid-Open Patent Application No. 2000-78851 (JP, P2000-78851A) discloses that in a case where the relay for compulsorily discharging the capacitor, namely a discharge relay, is provided in the circuit similar to the circuit as shown in FIG. 1, the resistor is serially inserted the contact of the discharge relay in order to prevent from the contact of the discharge relay from being welded. However, the method in which the resistor is serially inserted in relation to the relay contact cannot be applied in reality for the main relay as mentioned above in which the contact is directly inserted between the DC power supply and the load circuit.

Japanese Laid-Open Patent Application No. 2000-173428 (JP, P2000-173428A) describes a constitution such that a first welding detection circuit using a photo-coupler including a light emitting device connected between the DC power supply side of the contact of one main relay and the load circuit side of the other main relay; and a second welding detection circuit using a photo-coupler including a light emitting device connected between the DC power supply side of the contact of the other main relay and the load circuit side of one main relay, in the same way; are provided; and wherein the welding at the contact of the main relay can be independently detected by using these welding detection circuits. However, in this constitution, it is necessary to provide as many as two systems of the welding detection circuits which are directly connected to the DC power supply of 200 V or higher; and this results in requiring a high cost for the whole apparatus.

Under the present circumstances, in the system in which the contact of the main relay is inserted in each of the power supply line on the positive side from the DC power supply and the power supply line on the negative side from the DC power supply, when the welding of at least one of the main relay contacts occurs, there is no method for independently detecting whether the welding occurs on the positive side or the negative side without using an additional detection circuit and the special relay.

DISCLOSURE OF INVENTION

In this regard, an object of the present invention is to provide a method for independently detecting, with regard to the welding of the contact of the main relay on each of the positive side or the negative side, whether the welding of the contact occurs on the positive side or the negative side without causing an increase in the cost.

Another object of the present invention is to provide an apparatus for independently detecting, with regard to the welding of the contact of the main relay on each of the positive side or the negative side, whether the welding of the contact occurs on the positive side or the negative side without causing an increase in the cost.

A first object of the present invention is achieved by a method for detecting welding of a relay contact in a circuit which includes: a DC power supply having a first terminal and a second terminal; a load circuit supplied with electric power from the DC power supply by connecting to the first terminal and the second terminal; a first main relay having a contact which is inserted between the first terminal and one end of the load circuit; a second main relay having a contact which is inserted between the second terminal and the other end of the load circuit; and a precharge relay which is provided in parallel to the contact of the first main relay and comprises a series circuit of a resistor and a contact of the precharge relay; wherein the method comprises the step of, when shifting from a normal operation state in which the first main relay and the second main relay are controlled to be on and the precharge relay is controlled to be off to a suspension state in which the first main relay, the second main relay, and the precharge relay are controlled to be off, performing a sequence control to the first main relay, the second main relay and the precharge relay while measuring voltage across both ends of the load circuit to individually and separately detect the welding of the relay contact.

A second object of the present invention is achieved by an apparatus for detecting welding of a relay contact in a circuit which includes: a DC power supply having a first terminal and a second terminal; a load circuit supplied with electric power from the DC power supply by connecting to the first terminal and the second terminal; a first main relay having a contact which is inserted between the first terminal and one end of the load circuit; a second main relay having a contact which is inserted between the second terminal and the other end of the load circuit; and a precharge relay which is provided in parallel to the contact of the first main relay and comprises a series circuit of a resistor and a contact of the precharge relay; wherein the apparatus includes: a voltage detection means for detecting voltage across both ends of the load circuit; an instruction input means for receiving an instruction for shifting from a normal operation state in which the first main relay and the second main relay are controlled to be on and the precharge relay is controlled to be off to a suspension state in which the first main relay, the second main relay and the precharge relay are controlled to be off; and a control means for carrying out a sequence control to the first main relay, the second main relay and the precharge relay when the instruction is inputted and for individually and separately detecting the welding of the relay contact from a variance of the voltage detected by the voltage detection means occurring in accordance with the proceeding of the sequence control.

In the present invention, a capacitor for connecting both ends of the load circuit is typically provided in the circuit as described above.

For the sequence control used in the present invention, a various kinds of the sequence controls can be considered. However, considering that it is desirable that the number of steps to be taken is small; that the welding of the contact of the first main relay and the second main relay can be independently and securely detected; and that it can be guaranteed that the contact of each of the relays is in the suspension state when it is determined that the contact is in a normal state, it is preferable that the sequence control comprises: the first step for controlling the first main relay to be off; the second step for controlling the precharge relay to be on after the first step; the third step for controlling the second main relay to be off after the second step; and the fourth step for controlling the precharge relay to be off after the third step and to shift to the suspension state. Here, it can be determined that the contact of the first main relay is welded if the voltage across both ends of the load circuit does not drop at the first step; and that the contact of the second main relay is welded if the voltage across both ends of the load circuit does not drop at the third step. Thus, according to the present invention, it is possible to independently and securely determine, with regard to the welding at the contact of each of the main relays at the positive side and the negative side of the DC power supply, whether the welding occurs at the positive side or the negative side, by carrying out the sequence control to each of the relays when shifting from the ordinary operation state to the suspension state, without using the relay having the special mechanism or providing the additional detection circuit.

BEST MODE FOR CARRYING OUT THE INVENTION

Figure 1:
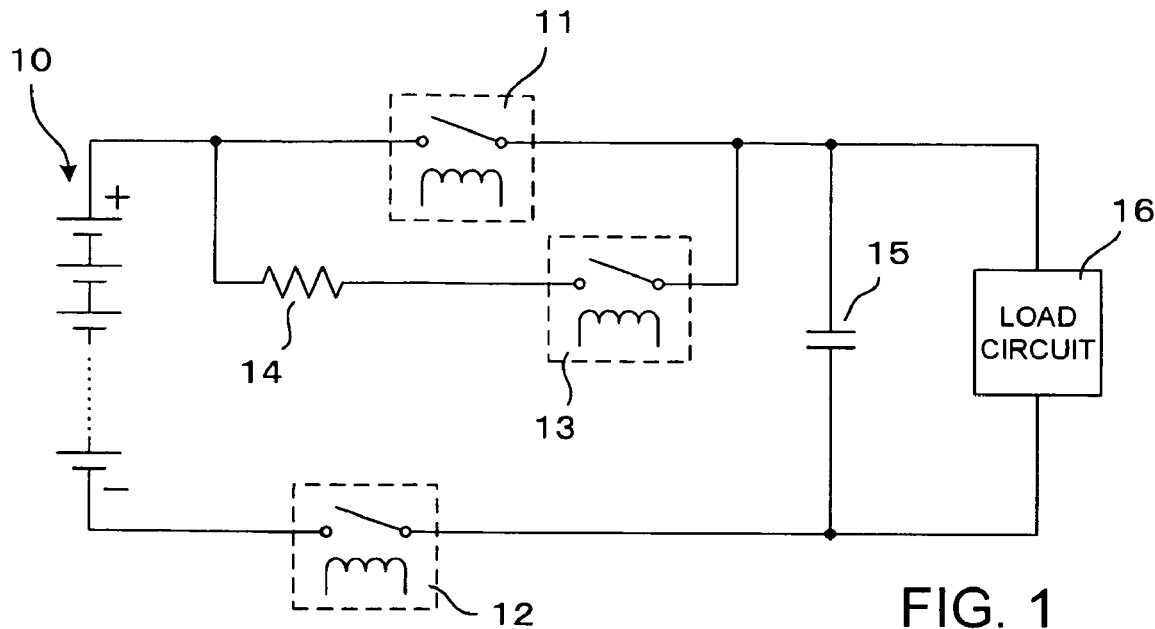
FIG. 1 is a schematic circuit diagram showing a typical circuit including a relay contact.
Figure 2:
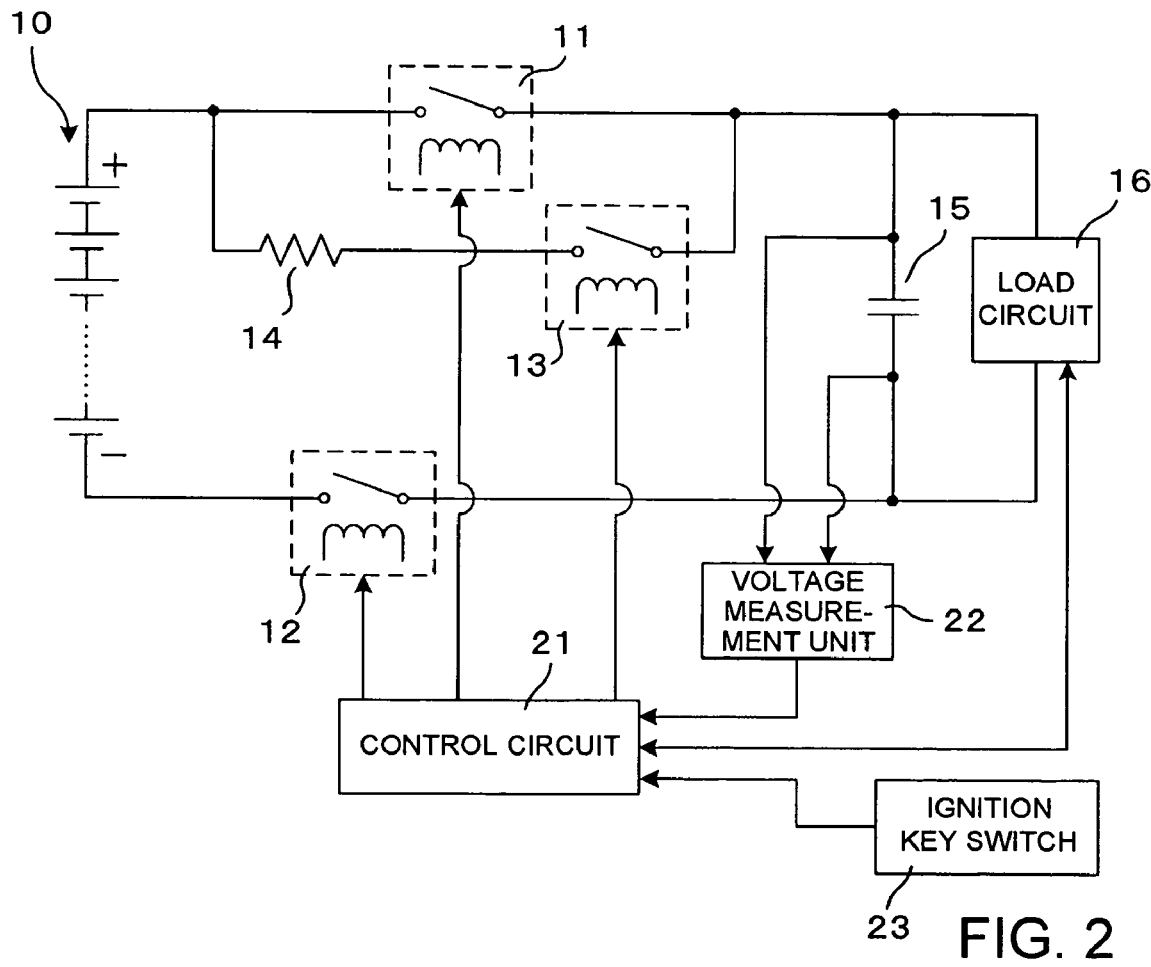
FIG. 2 is a view showing one example of a circuit to which a method for detecting a welding of the relay contact according to the present invention is applied.

FIG. 2 is a view showing one example of a circuit to which a detection method according to the present invention applies. The circuit is intended for application to an electric automobile or a hybrid electric automobile, and has the same configuration as the circuit as shown in FIG. 1. However, FIG. 2 differs from FIG. 1 in the points such that control circuit 21 for controlling load circuit 16 and for performing an ON/OFF control of first main relay 11, second main relay 12 and precharge relay 13; voltage measuring unit 22 for measuring and outputting to control circuit 21 the voltage across both ends of capacitor 15, that is, the voltage across both ends of load circuit 16; and ignition key switch 23 interlocked with an ignition key in the electric automobile or the hybrid electric automobile are clearly shown. Load circuit 16 is, typically, an inverter circuit. Since this circuit is a circuit for the electric automobile or the hybrid automobile, control circuit 21 itself does not operate by the power from battery pack 10 but by the power from an auxiliary power supply (not shown) such as an accumulator battery of a low voltage (for example, 12 V) which is provided separately.

In the case of the electric automobile or the hybrid automobile, a configuration such that control circuit 21 for controlling each of the relays 11 to 13 and load circuit 16 which is the inverter circuit and that ignition key switch 23 is connected to control circuit 21 is self-evident to the person skilled in the art. In the same way, because the inverter circuit (load circuit 16) is provided with a measurement circuit for measuring an input voltage thereto, the measurement circuit can be used for voltage control unit 22. As a result, the configuration of the circuit as shown in FIG. 2 itself is a common configuration for an on-vehicle circuit. The present invention, rather, as will be explained below, is characterized in that the common circuit like this is employed therein and that the welding of the contact of each of the main relays 11, 12 is individually and separately detected by a control sequence by means of a software control over the relay.

Figure 3:
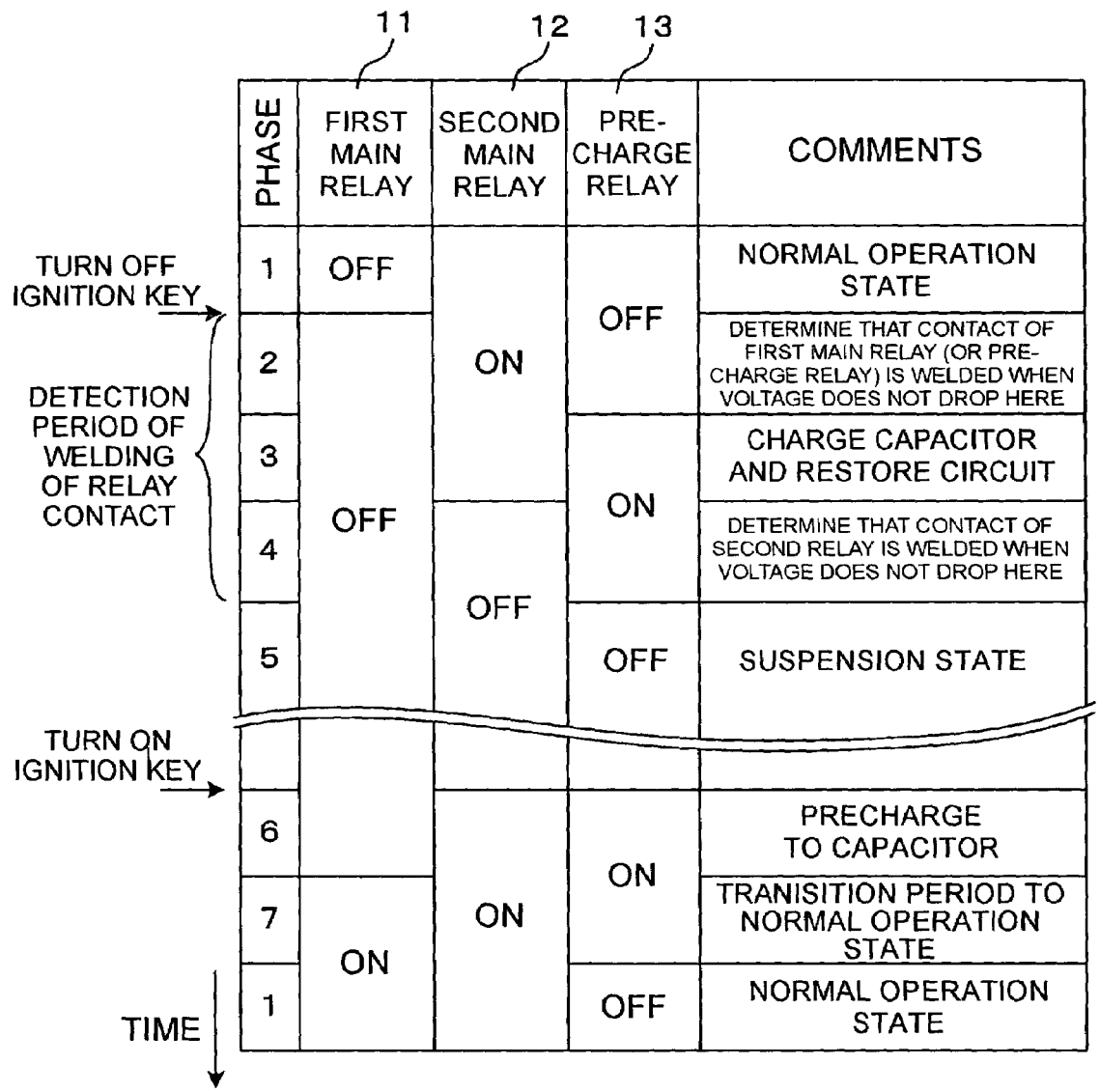
FIG. 3 is a view showing a processing in a method for detecting the welding of the relay contact according to one embodiment of the present invention as a time sequence.

Next, the process of detecting the relay contact welding in the circuit shown in FIG. 2 will be explained. As is described above, in this embodiment, it is possible to detect the welding of contacts of first main relay 11 and second main relay 12 independently by devising the sequence of ON/OFF control of each of relays 11 to 13 without using any special detection circuit or the relay of a special structure. FIG. 3 shows the sequence for detection of the welding in this case.

In this embodiment, when shifting from a normal operation state to a suspension state, control circuit 21 performs the sequence control of the ON/OFF control of each of relays 11 to 13, and the welding of the contacts of each of relays 11 to 13 is detected. The normal operation refers to the state in which, in the case of the circuit for the electric automobile and the hybrid automobile, for example, the power is supplied from battery pack 10 to load circuit 16 so that a motor is driven. In addition, the suspension state refers to the state in which the supply of power to load circuit 16 is suspended.

In the normal operation state, as shown in phase 1 in FIG. 3, each of the contacts of first main relay 11 and second main relay 12 are controlled to be on (set to a conductive state), and the contact of precharge relay 13 is controlled to be off (set to an interruption state). At this time, capacitor 15 is charged up to the level of the voltage of battery pack 10. If the ignition key of the vehicle is turned off, it is detected by ignition key switch 23 that the ignition key is turned off and this is notified to control circuit 21. Then, control circuit 21 starts the sequence for detecting the welding and for shifting to the suspension state. First, in phase 2, control circuit 21 controls the contact of first main relay 11 on the positive side to be off. If the contact of each of the relays is normal, an electric charge stored in capacitor 15 is discharged via load circuit 16, and the voltage across both ends of capacitor 15 is decreased toward zero. Here, if the voltage across both ends of capacitor 15, which is measured by voltage measurement unit 22, does not drop, the electric power is continued to be supplied from battery pack 10 to capacitor 15. Accordingly, it can be determined that the relay contact of at least one of first main relay 11 and precharge relay 13 is fixed by welding. Because the current flowing into the contact of precharge relay 13 is restricted by resistor 14, it is possible to reduce a failure rate due to welding of the contact of precharge relay 13 down to substantially zero by appropriately selecting the value of resistor 14. In this case, it can surely be determined that the contact of first main relay 11 is welded. In addition, the voltage across both ends of capacitor 15 in a case where first main relay 11 is welded is substantially equal to a terminal voltage of battery pack 10; on the other hand, in a case where the contact of first main relay 11 is normal and the contact of precharge relay 13 is welded, the voltage across both end of capacitor 15 become the values obtained by dividing the voltage of the terminal voltage of battery pack 10 by a voltage division circuit constituted by resistor 14 and load circuit 16. Therefore, depending on the value of resistor 14, it is also possible to isolate the phenomenon of welding of the contact between first main relay 11 and precharge relay 13 by determining at which value the voltage across both ends of capacitor 15 converges.

In phase 3, which is continued from phase 2 as described above, the contact of precharge relay 13 is controlled to be on. As a result, since second main relay 12 is still in the on state, capacitor 15 is charged via precharge relay 13, and the voltage across both ends of capacitor 15 is raised. After that, in phase 4, the contact of second main relay 12 on the negative side is controlled to be off. If the contact of each of the relays is normal, the electric charge stored in capacitor 15 is discharged via load circuit 16; and the voltages across both ends of the capacitor 15 drops toward zero. Here, if the voltage across both ends of capacitor 15, which is measured by voltage measurement unit 22, does not drop, it means that capacitor 15 is continuously supplied with the electric power from battery pack 10; and it can be determined that the contact of second main relay 12 is fixed by welding. After that, by controlling precharge relay 13 to be off, the sequence shifts to phase 5 which is the suspension state. In this case, by the self-shutdown function of control circuit 21 itself, the power supply from the auxiliary power supply to control circuit 21 may also be suspended after the shift to phase 5.

As described above, the sequence for detection of the welding of the relay contact in this embodiment is explained.

In this sequence, it is possible to securely determine the welding of the contact of first main relay 11 and second main relay 12 independently without using the relay of a special structure or substantially adding the detection circuit. In addition, if it is determined that the contact is in the normal state throughout the sequence, it is guaranteed that all the contacts of all relays 11, 12, 13 are in a state of interruption and non-welding during the suspension state of phase 5; therefore, the safety of the circuit can be further improved.

Next, the shift from the suspension state to the normal operation state will be explained. When the ignition key is turned on, in accordance with the common constitution of the on-vehicle circuit, the electric power is supplied from the auxiliary power supply to control circuit 21 and control circuit 21 is activated. First, in phase 6, control circuit 21 controls second main relay 12 and precharge relay 13 to be on, and the precharge to capacitor 15 is started. When capacitor 15 is charged after a lapse of a predetermined time, next, in order to shift to the normal operation state, first main relay 11 is also controlled to be on in phase 7. After that, precharge relay 13 is controlled to be off and the sequence completely shifts to the normal operation state (phase 1).

Figure 4:
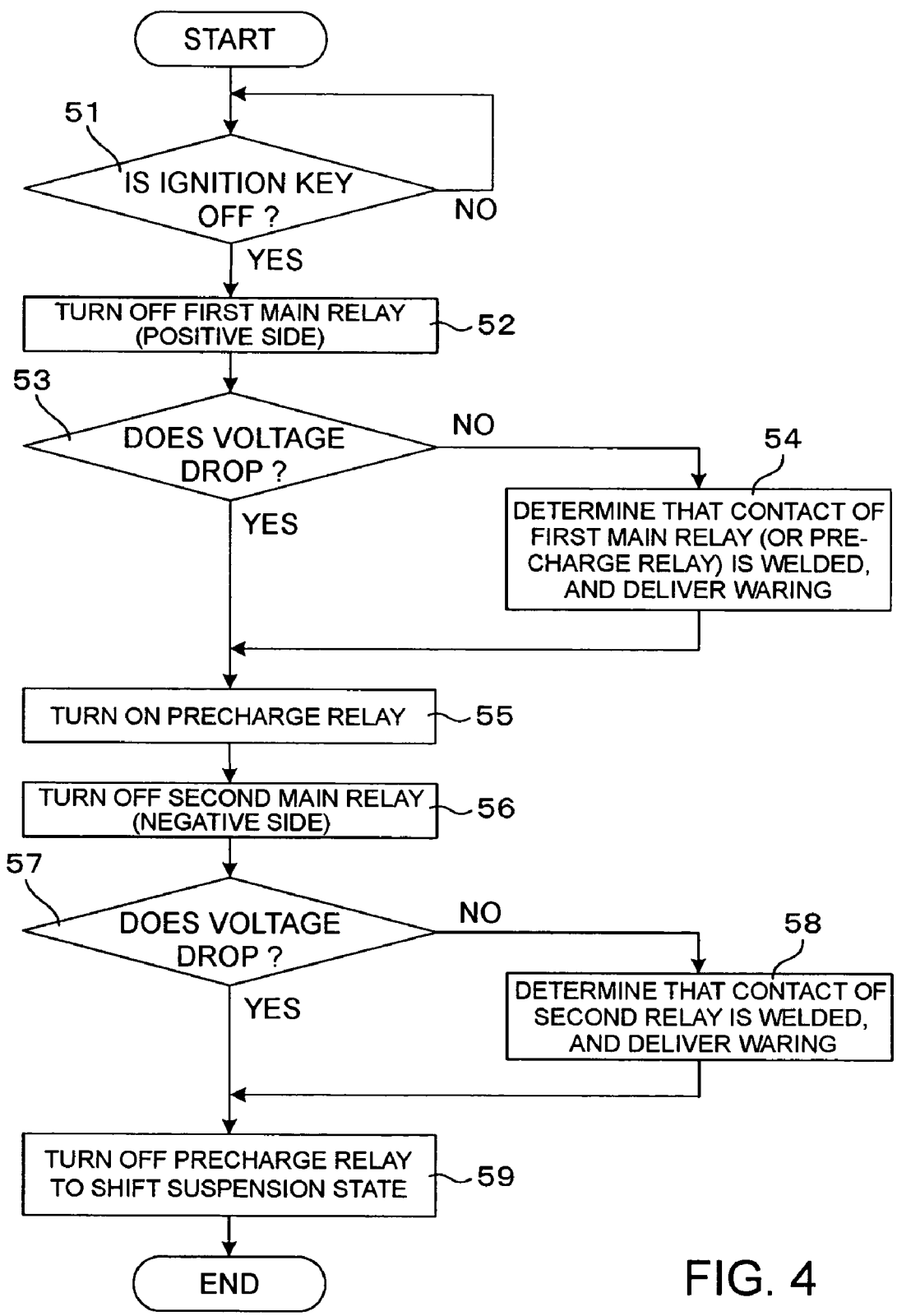
FIG. 4 is a flow chart showing an operation of a control circuit.

Next, the detail of the processing carried out by control circuit 21 in order to detect the welding of the contact will be explained with reference to the flow chart of FIG. 4.

In the normal operation state, first main relay 11 and second main relay 12 are controlled to be on; and precharge relay 13 is controlled to be off. This is an initial state of the processing to be described below.

First, in step 51, it is determined whether or not the ignition key is turned off and the processing waits until the ignition key is turned off. When the ignition key is turned off, first main relay 11 is controlled to be off in step 52. Then, in step 53, it is determined whether or not the voltage measured by voltage measurement unit 22 drops. If it is determined that the voltage drops, the processing shifts to step 55 as it is; and if it is determined that the voltage does not drop, it is determined in step 54 that there occurs the welding of the contact of first main relay 11 (or precharge relay 13) and a warning is outputted. In step 55, precharge relay 55 is controlled to be on. When capacitor 15 is charged after the lapse of the predetermined time and the like, second main relay 12 is controlled to be off in step 56. Then, in step 57, it is determined whether or not the voltage measured by voltage measurement unit 22 drops. If it is determined that the voltage drops, the processing shifts to step 59 as it is; and if it is determined that the voltage does not drop, it is determined in step 58 that there occurs the welding of the contact of second main relay 12 and the warning is outputted. In addition, if it is determined that the voltage does not drop, an error code is recorded within a nonvolatile memory region in control circuit 21. In step 59, precharge relay 59 is controlled to be off and is shifted to the suspension state.

The output of the warning in steps 54 and 58 include, for example, a display of the warning to the operator, the recording of the error codes in the nonvolatile memory region in control circuit 21, and the like. When the error code is recorded within the nonvolatile memory region, the warning is displayed to the operator and the like again at the time of a next startup, for example, at the time when the ignition key is set to be on for the next time.

The invention claimed is:

1. A method for detecting welding in a circuit, the circuit comprising:
    a DC power supply having a first terminal and a second terminal;
    a load circuit supplied with electric power from the DC power supply by connecting the load circuit to the first terminal and the second terminal;
    a first relay having a contact which is inserted between the first terminal and one end of the load circuit;
    a second relay having a contact which is inserted between the second terminal and another end of the load circuit; and
    a resistor provided in series with a third relay having a contact, the resistor and the contact of the third relay provided in parallel to the contact of the first relay,
    the method comprising:
    shifting from a normal operation state, in which the first relay and the second relay are controlled to be on and the third relay is controlled to be off, to a suspension state, in which the first relay, the second relay and the third relay are controlled to be off, and
    when shifting from the normal operation state to the suspension state, performing a sequence control to the first relay, the second relay and the third relay while measuring voltage across the one and the other end of the load circuit to individually detect whether the first relay is welded and whether the second relay is welded.

2. The method according to claim 1, wherein the circuit is provided to a vehicle having an ignition key switch; and the sequence control is initiated when it is detected that the ignition key switch is turned off.

3. The method according to claim 1, wherein the sequence control comprises, in this sequence: first controlling the first relay to be off; second controlling the third relay to be on; third controlling the second relay to be off; and fourth controlling the third relay to be off.

4. The method according to claim 3, wherein if the voltage across the one end and the other end of the load circuit does not drop when the first relay is controlled to be off, it is determined that the contact of the first relay is welded.

5. The method according to claim 4, wherein if the voltage across the one end and the other end of the load circuit does not drop when the second relay is controlled to be off, it is determined that the contact of the second relay is welded.

6. The method according to claim 1, wherein the circuit is provided with a capacitor connected to the one end and the other end of the load circuit.

7. The method according to claim 6, wherein the circuit is provided to a vehicle having the ignition key switch; and wherein the sequence control is initiated when it is detected that the ignition key switch is turned off.

8. The method according to claim 6, wherein the sequence control comprises, in this sequence: first controlling the first relay to be off; second controlling the precharge relay to be on; third controlling the second relay to be off; and fourth controlling the third relay to be off.

9. The method according to claim 8, wherein if the voltage across the one end and the other end of the load circuit does not drop when the first relay is controlled to be off, it is determined that the contact of the first relay is welded.

10. The method according to claim 8, wherein if the voltage across the one end and the other end of the load circuit does not drop when the second relay is controlled to be off, it is determined that the contact of the second relay is welded.

11. The method according to claim 1, wherein the DC power supply is a battery pack.

12. An apparatus for detecting a welding in a circuit, the circuit comprising
    a DC power supply having a first terminal and a second terminal;

a load circuit supplied with electric power from the DC power supply by connecting the load circuit to the first terminal and the second terminal;

a first relay having a contact which is inserted between the first terminal and one end of the load circuit;

a second relay having a contact which is inserted between the second terminal and another end of the load circuit; and a resistor provided in series with a third relay having a contact, the resistor and the contact of the third relay provided in parallel to the contact of the first relay, the apparatus comprising:

a voltage detection means for detecting voltage across the one end and the other end of the load circuit;

an instruction input means for receiving an instruction for shifting the circuit from a normal operation state, in which the first relay and the second relay are controlled to be on and the third relay is controlled to be off, to a suspension state, in which the first relay, the second relay and the third relay are controlled to be off; and a control means for carrying out a sequence control to the first relay, the second relay and the third relay when the instruction is received and for individually detecting whether the first relay is welded and whether the second relay is welded from a variance of the voltage detected by the voltage detection means occurring in accordance with proceeding of the sequence control.

13. The apparatus according to claim 12, wherein the sequence control comprises, in this sequence: first controlling the first relay to be off; second controlling the third relay to be on; third controlling the second relay to be off; and fourth controlling the third relay to be off; wherein said control means determines that the contact of the first relay is welded and delivers a warning if the voltage across the one end and the other end of the load circuit does not drop when the first relay is controlled to be off; and determines that the contact of the second relay is welded and delivers a warning if the voltage across the one end and the other end of the load circuit does not drop when the second relay is controlled to be off.

14. The apparatus according to claim 12, wherein the circuit has a capacitor connected to the one end and the other end of the load circuit.

15. The apparatus according to claim 14, wherein the sequence control comprises, in this sequence: first controlling the first relay to be off; second controlling the third relay to be on; third controlling the second relay to be off; and fourth controlling the third relay to be off; wherein said control means determines that the contact of the first relay is welded and delivers a warning if the voltage across the one end and the other end of the load circuit does not drop when the first main relay is controlled to be off; and determines that the contact of the second relay is welded and delivers a warning if the voltage across the one end and the other end of the load circuit does not drop when the second relay is controlled to be off.

16. A combination of a circuit and an apparatus for detecting a welding in the circuit, the circuit comprising:

a DC power supply having a first terminal and a second terminal;

a load circuit supplied with electric power from the DC power supply by connecting the load circuit to the first terminal and the second terminal;

a first relay having a contact which is inserted between the first terminal and one end of the load circuit;

a second relay having a contact which is inserted between the second terminal and another end of the load circuit; and a resistor provided in series with a third relay having a contact, the resistor and the contact of the third relay provided in parallel to the contact of the first relay, the apparatus comprising:

a voltage detection means for detecting voltage across the one end and the other end of the load circuit;

an instruction input means for receiving an instruction for shifting the circuit from a normal operation state, in which the first relay and the second relay are controlled to be on and the third relay is controlled to be off, to a suspension state, in which the first relay, the second relay and the third relay are controlled to be off; and a control means for carrying out a sequence control to the first relay, the second relay and the third relay when the instruction is received and for individually detecting whether the first relay is welded and whether the second relay is welded from a variance of the voltage detected by the voltage detection means occurring in accordance with proceeding of the sequence control.

17. The combination according to claim 16, wherein the sequence control comprises, in this sequence: first controlling the first relay to be off second controlling the third relay to be on; third controlling the second relay to be off and fourth controlling the third relay to be off;

wherein said control means determines that the contact of the first relay is welded and delivers a warning if the voltage across the one end and the other end of the load circuit does not drop when the first relay is controlled to be off and determines that the contact of the second relay is welded and delivers a warning if the voltage across the one end and the other end of the load circuit does not drop when the second relay is controlled to be off.

18. The combination according to claim 16, wherein the circuit has a capacitor connected to the one end and the other end of the load circuit.

19. The combination according to claim 18, wherein the sequence control comprises, in this sequence: first controlling the first relay to be off; second controlling the third relay to be on; third controlling the second relay to be off; and fourth controlling the third relay to be off;

wherein said control means determines that the contact of the first relay is welded and delivers a warning if the voltage across the one end and the other end of the load circuit does not drop when the first main relay is controlled to be off; and determines that the contact of the second relay is welded and delivers a warning if the voltage across the one end and the other end of the load circuit does not drop when the second relay is controlled to be off.

* * * * *